US007019923B2

(12) United States Patent
Leighton et al.

(10) Patent No.: US 7,019,923 B2
(45) Date of Patent: Mar. 28, 2006

(54) PRE-AMPLIFIER EMPLOYING TRANSISTORS HAVING A DIMINISHED BREAKDOWN VOLTAGE AND A DISK DRIVE AND A THEVENIN WRITER EMPLOYING THE SAME

(75) Inventors: John D. Leighton, Anoka, MN (US); Hao Fang, Savage, MN (US); Michael J. O'Brien, St. Paul, MN (US); Scott O'Brien, Eagan, MN (US); Cameron C. Rabe, Inver Grove Heights, MN (US)

(73) Assignee: Agere Systems Inc., Allentown, PA (US)

( * ) Notice: Subject to any disclaimer, the term of this patent is extended or adjusted under 35 U.S.C. 154(b) by 297 days.

(21) Appl. No.: 10/420,236

(22) Filed: Apr. 22, 2003

(65) Prior Publication Data

US 2003/0234689 A1    Dec. 25, 2003

Related U.S. Application Data

(60) Provisional application No. 60/374,750, filed on Apr. 22, 2002.

(51) Int. Cl.
*G11B 5/09*    (2006.01)

(52) U.S. Cl. .......................... 360/46; 360/68; 330/252; 327/110

(58) Field of Classification Search .................. 360/46, 360/68, 67, 66; 330/252, 261; 327/108, 327/110, 494, 497, 420, 423, 491, 502
See application file for complete search history.

(56) References Cited

U.S. PATENT DOCUMENTS

| 3,497,824 | A | * | 2/1970 | Goordman | .................. | 330/258 |
| 6,388,476 | B1 | * | 5/2002 | Isobe et al. | .................. | 327/110 |
| 6,512,646 | B1 | * | 1/2003 | Leighton et al. | .............. | 360/46 |
| 6,525,896 | B1 | * | 2/2003 | Chung et al. | .................. | 360/68 |

OTHER PUBLICATIONS

"Influence of Impact-Ionization-Induced Instabilities on the Maximum Usable Output Voltage of Si-Bipolar Transistors" by Matthias Rickelt, et al.; IEEE Transactions on Electronic Devices; vol. 48, No. 4; Apr. 2001; pp. 774-783.

* cited by examiner

*Primary Examiner*—Alan T. Faber

(57) ABSTRACT

A pre-amplifier, a Thevenin writer and a disk drive employing transistors having a breakdown voltage below a circuitry operating voltage. In one embodiment, the pre-amplifier includes an emitter-follower transistor pair couplable to a power supply and a differential transistor pair, having a collector-emitter breakdown voltage below a voltage of the power supply, that receives current from, and controlled by, the emitter-follower transistor pair.

21 Claims, 3 Drawing Sheets

US 7,019,923 B2

PRE-AMPLIFIER EMPLOYING TRANSISTORS HAVING A DIMINISHED BREAKDOWN VOLTAGE AND A DISK DRIVE AND A THEVENIN WRITER EMPLOYING THE SAME

CROSS REFERENCE TO PROVISIONAL APPLICATION

This application claims the benefit of U.S. Provisional Application No. 60/374,750, entitled "NPN Breakdown-Voltage Requirements For High-Voltage Writer Applications" and filed on Apr. 22, 2002.

TECHNICAL FIELD OF THE INVENTION

The present invention is directed, in general, to a pre-amplifier and, more specifically, to a pre-amplifier employing transistors having a breakdown voltage below a voltage of a power supply thereof.

BACKGROUND OF THE INVENTION

Integrated circuits are used extensively in various existing technological systems including computer systems. As the use of computer systems continues to increase, so does the demand for improved computers such as smaller and faster computers. To keep pace with the demand for improved computers, the semiconductor industry has been producing devices operating at higher speeds.

Typically, a cost or consequence of a semiconductor device operating at a higher speed is a decrease in the breakdown voltage of the device. When the breakdown voltage of a transistor, for example, is exceeded, undesirable currents are generated that have to be compensated. One such undesirable current results from avalanche multiplication in the collector-base depletion region of a transistor.

Avalanche multiplication is a process in which energetic electrons collide with a lattice of the semiconductor and create additional free carriers. As the voltage applied to the collector is increased, the collector-base depletion region broadens. As a result of this broadening, an electric field intensity within the depletion region increases. Accordingly, the electric field accelerates the free carriers that are traversing this junction. As the electric field increases, the free carriers gain kinetic energy and momentum.

A few of the most energetic free carriers may have sufficient kinetic energy to create electron-hole pairs when colliding with atoms of the semiconductor lattice. The electron hole-pairs may contribute to collector and base currents. The newly liberated electron of the electron-hole pair may contribute to the collector-current by the electric field sweeping the liberated electron in the same direction as the free carrier, or incident electron, that liberated it. Thus, the collector-current may increase due to the collision event.

The newly generated hole from the electron-hole pair, however, may be swept by the electric field to the base and contribute to the base current. The hole may be directed from the collector-base depletion region toward the neutral base region and out of the base contact resulting in a negative base-current, or a base-current that is of the opposite polarity as a normal transistor base-current. The total base-current, therefore, may be reduced due to avalanche multiplication.

As the collector-emitter voltage continues to increase, the base-current continues to decrease and can actually become negative. The further the collector-emitter voltage is increased, the base-current may become more negative. The collector-emitter voltage at which the base-current crosses zero is defined as the collector-emitter breakdown voltage, $BV_{CEO}$.

Consequently, transistors having a low $BV_{CEO}$ are not typically employed in high operating voltage environments but instead may be used within circuitry of devices having a low operating voltage to prevent avalanche multiplication and other undesirable results. The demand for faster operating computers, however, often requires circuitry with higher operating voltages and faster operating speeds. A trade-off, therefore, between the operating voltage and the operating speed of transistors in the circuitry of devices is continually made to produce improved devices.

Accordingly, what is needed in the art is circuitry, including transistors, that are capable of operating at a high speed and at a high operating voltage.

SUMMARY OF THE INVENTION

To address the above-discussed deficiencies of the prior art, the present invention provides a pre-amplifier, a Thevenin writer and disk drive. In one embodiment, the pre-amplifier includes an emitter-follower transistor pair couplable to a power supply and a differential transistor pair, having a collector-emitter breakdown voltage below a voltage of the power supply, that receives current from, and controlled by, the emitter-follower transistor pair.

Typically, high voltage circuitry requires transistors with a high breakdown voltage that are larger and slower than lower breakdown-voltage transistors. The present invention, therefore, may improve performance of high voltage circuitry by advantageously employing transistors that have a lower collector-emitter breakdown voltage, $BV_{CEO}$, than an operating voltage of the circuitry. The collector-emitter breakdown voltage $BV_{CEO}$ is the collector-emitter voltage of a bipolar transistor at which the base current crosses zero. A NPN bipolar transistor may be operated above the collector-emitter breakdown voltage $BV_{CEO}$ if impact-ionized holes due to avalanche multiplication are extracted from a base region of the transistor to prevent β, current gain of the transistor, multiplication. A minimum current gain may then be established based on an amount of base-current that is acceptable for extraction.

In another aspect, the present invention provides a Thevenin writer, coupled to a power supply, that includes a write head, an emitter-follower transistor pair and a differential transistor pair. The emitter-follower transistor pair is coupled to the write head and the power supply. The differential transistor pair, having a collector-emitter breakdown voltage below a voltage of the power supply, receives current from, and is controlled by, the emitter-follower transistor pair.

In another aspect, the present invention provides a disk drive coupled to a power supply that includes a chassis, a motor coupled to the chassis, a platter coupled to the motor for rotation thereby, a write head actuator coupled to the chassis, a write arm coupled to the write head actuator for movement relative to the platter and a write head coupled to the write arm distal to the write head actuator and including a Thevenin writer. The Thevenin writer includes an emitter-follower transistor pair couplable to the power supply and a differential transistor pair, having a collector-emitter breakdown voltage below a voltage of the power supply, that receives current from, and controlled by, the emitter-follower transistor pair.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
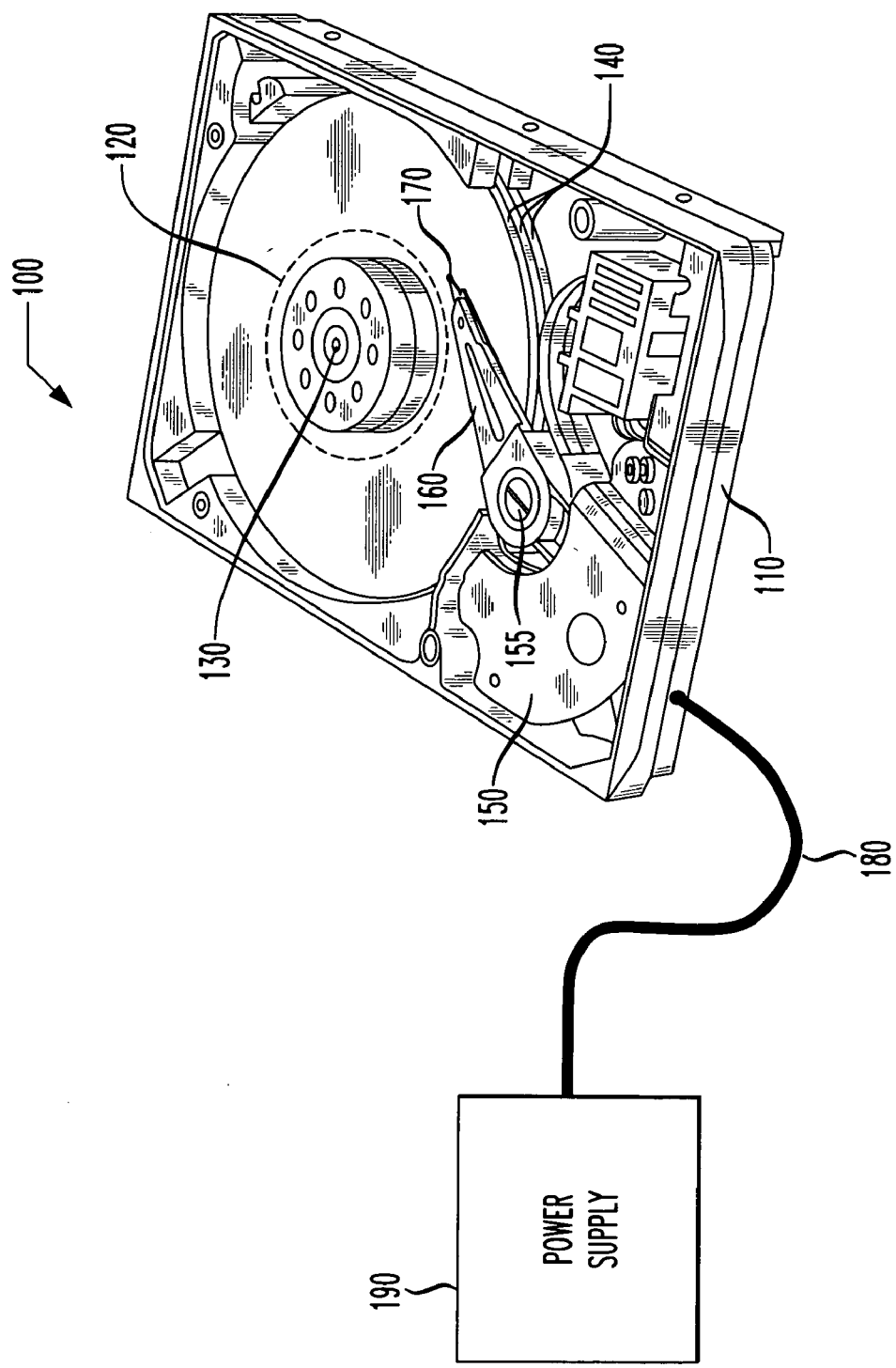
FIG. 1 illustrates a system diagram of an embodiment of a hard disk drive constructed in accordance with the principals of the present invention.

Referring initially to FIG. 1, illustrated is a system diagram of an embodiment of a hard disk drive, generally designated 100, constructed in accordance with the principals of the present invention. The hard disk drive 100 includes a chassis 110, a motor 120, a spindle 130, a platter 140, a write head actuator 150, an actuator axis 155, a write head actuator arm 160 and a write head 170. The hard disk drive 100 is coupled to a power supply 190 via a power cable 180.

The hard disk drive 100 provides a medium for storing and retrieving bits of data. In the illustrated embodiment, the hard disk drive 100 provides data storage for a computer. One skilled in the pertinent art will understand the storage and retrieval of data to/from a hard disk drive in a computer. For a more detailed discussion of the operation and components of a hard disk drive, please see "The Indispensable PC Hardware Book," Hans-Peter Messmer, (Addison Wesley Longman, 3d ed. 1997), incorporated herein by reference in its entirety. One skilled in the art will also understand that the present invention may apply to other disk drives in addition to a hard disk drive.

The chassis 110 may encase and contain components of the hard disk drive 100. The chassis 110 may protect the components of the hard disk drive 100 while also providing assess to and from the components. Additionally, the chassis 110 may include a mounting device for attaching the hard disk drive 110 to a frame of the computer.

The motor 120 and the write head actuator 150 may be coupled to the chassis 110 and respectively rotate the platter 140 and move the write head 170 to write the bits at designated sectors and tracks on the platter 140. The motor 120 rotates the spindle 130 which in turn rotates the platter 140. The rotation of the spindle 130 is typically controlled by a feedback control circuit to ensure a sufficiently constant speed.

The write head actuator 150 is a mechanical device that moves and controls the write arm 160. Located at the center of the write head actuator 150 is the actuator axis 155 that assists in smoothly moving the write arm 160. The write arm 160, coupled to the write head actuator 150, is a mechanical arm which supports and extends the write head 170 over and in-between the platter 140 and provides movement relative to the platter 140.

The write head 170 may be coupled to the write arm 160 distal to the write head actuator 150 and include a Thevenin writer. The Thevenin writer may include an emitter-follower transistor pair couplable to the power supply 190 and a differential transistor pair, having a collector-emitter breakdown voltage below a voltage of the power supply 190, that receives current from, and controlled by, the emitter-follower transistor pair.

The emitter-follower transistor pair may have a low current gain. For example, the current gain may be ten or two in some instances. The emitter-follower transistor pair may also have a collector-emitter breakdown voltage below the power supply voltage. In some embodiments, the power supply voltage may be about ten volts and the collector-emitter breakdown voltage may be about three volts. In other embodiments, the power supply voltage may be about twelve volts and the collector-emitter breakdown voltage may be about five volts.

The platter 140 may include three disks of an aluminum alloy with a data medium of a magnetizable coating deposited on each side of the disks. Typically, the write head 170 writes the bits onto the platter 140 as magnetizations in designated sectors as instructed by a controller. One skilled in the art will understand the operation and configuration of the hard disk drive 100.

The power cable 180 may be a standard power cable employed within a conventional computer. The power supply 190 may employ standard components of a power supply typically employed within a conventional computer. The power supply 190, coupled to the hard disk drive 100, may provide a direct current voltage of ten volts for the hard disk drive 100. In other embodiments, the power supply 190 may provide a direct current voltage of twelve volts. Of course, one skilled in the art will understand that the voltage provided by the power supply may vary. In some embodiments, the hard disk drive 100 may include a power supply within the chassis 110.

Figure 2:
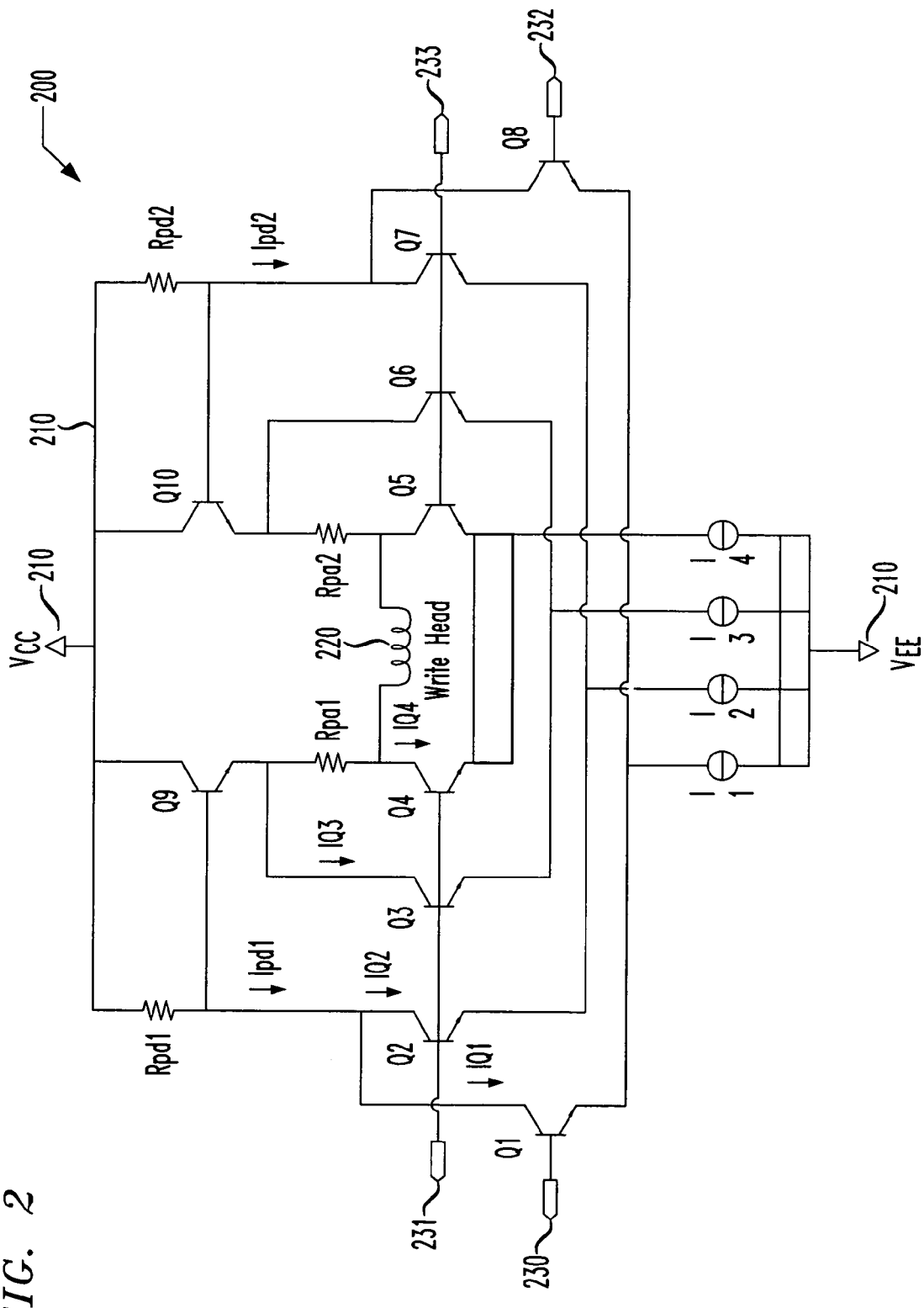
FIG. 2 illustrates an embodiment of a schematic of a Thevenin writer constructed in accordance with the principals of the present invention.

Turning now to FIG. 2, illustrated is an embodiment of a schematic of a Thevenin writer, generally designated 200, constructed in accordance with the principals of the present invention. The Thevenin writer 200 includes a power supply 210, a write head 220, control ports 230, 231, 232, 233, resistors Rpd1, Rpd2, Rpa1, Rpa2, constant current devices I1, I2, I3, I4, an emitter-follower transistor pair and four differential transistor pairs. The emitter-follower transistor pair includes transistors Q9, Q10. The four differential transistor pairs includes a first transistor pair Q1, Q8, a second transistor pair Q2, Q7, a third transistor pair Q3, Q6, and a fourth transistor pair Q4, Q5.

The Thevenin writer 200 may be a write head driver employed within a conventional computer to write bits of data on a storage medium such as a platter. The power supply 210 may provide power for operation of the Thevenin writer 200. The power supply 210 may be a standard power supply typically employed within a conventional computer. The power supply 210 may include a positive and a negative node VCC, VEE.

The positive node VCC of the power supply 210 may be coupled via each collector to the transistors Q9, Q10. Bases of the transistors Q9, Q10, may be coupled to and driven by the resistors Rpd1, Rpd2, whereas emitters of the transistors Q9, Q10, may be coupled to the third differential transistor pair Q3, Q6, and the fourth differential transistor pair Q4, Q5. The resistors Rpa1, Rpa2, may be coupled between emitters of the transistors Q9, Q10, and collectors of the transistors Q4, Q5. The third differential transistor pair Q3, Q6, and the fourth differential transistor pair Q4, Q5, may receive current from the transistors Q9, Q10. The four differential transistor pairs and the emitter-follower pair may be NPN bipolar transistors.

The four differential transistor pairs may receive signals via the control ports 230, 231, 232, 233. The signals may originate from a controller, such as the controller discussed with respect to the write head 170 of FIG. 1, to control operation of the four differential transistor pairs. The control ports 230, 232, may be coupled to bases of the first differential transistor pair and the control ports 231, 232, may be coupled to bases of the second, third and fourth differential transistor pairs. Emitters of the four differential transistor pairs may be coupled to the constant current devices I1, I2, I3, I4, respectively.

The four differential transistor pairs and the emitter-follower transistor pair may cooperate to control current flow through the write head 220 to write the data bits on the storage medium. The first and second differential transistor pair may provide voltage mode control for operation of the Thevenin writer 200. The third differential transistor pair may maintain an emitter-follower tail current when the transistors Q9 and Q10 are turned off. The fourth differential transistor pair may provide a current boost to the write head 220 to compensate for a current drop across resistors Rpa1 and Rpa2.

Typically, a high voltage relative to a voltage of the power supply 210 is applied across terminals of the emitter-follower transistor pair and the four differential transistor pairs. The differential transistor pairs are exposed to a high voltage when within an "off" side of the Thevenin writer 200 and exposed to a low voltage when within an "on" side of the Thevenin writer 200. For example, a signal received from the control port 233 may turn off the transistor Q5 resulting in a high voltage across the transistor Q5 and current flowing through the write head 220 from the transistor Q10 to the transistor Q4. While turned off, the transistor Q5 may not breakdown until a minimum of a collector-base breakdown voltage, $BV_{CBO}$, and a minimum of a collector-emitter blocking voltage, $BV_{CES}$, is applied across the collector-emitter. The collector-base breakdown voltage $BV_{CBO}$ is the collector-base voltage at which the base-current crosses zero and the collector-emitter blocking voltage $BV_{CES}$ is the collector-emitter voltage in an off state when a reverse-biased pn junction occurs. Since the breakdown of the transistor Q5 may be determined by the collector-base breakdown voltage $BV_{CBO}$ and the collector-emitter blocking voltage $BV_{CES}$, then the collector-emitter breakdown voltage $BV_{CEO}$ of transistor Q5 may be below the voltage of the power supply 210.

When transistor Q5 is off, the "on" transistor, for example the transistor Q4, may break down at a voltage that is less than the collector-base breakdown voltage $BV_{CBO}$ and the collector-emitter blocking voltage $BV_{CES}$ but is acceptable since transistor Q4 is exposed to a lower voltage relative to the voltage of the power supply 210 when turned on. Though the fourth differential transistor pair was discussed, the first, second and third differential transistor pair may also behave accordingly. Thus, the four differential transistor pairs may be operated in a high voltage environment limited by the collector-base breakdown voltage $BV_{CBO}$ and the collector-emitter blocking voltage $BV_{CES}$.

Typically, the emitter-follower transistor pairs continuously remain turned on independent of each collector-emitter voltage. When the collector-emitter voltage of the emitter-follower transmitter pair is low relative to the voltage of the power supply 210, the operating current of the transistors Q9 and Q10 is high. When a maximum voltage appears across the emitter-follower transistor pair, the transistors Q9 and Q10 operate at a low current. Accordingly, a current gain for the emitter-follower transistor pair is not critical and may be small. For example, the transistors Q9, Q10, may have one-fifth of a maximum current flowing when the maximum voltage appears across each collector-emitter permitting a minimum current gain as small as two. A minimum current gain of two in this low current condition may approximate a minimum current gain of ten when the transistors Q9, Q10, are operating at the maximum current.

The fourth differential transistor pair Q4, Q5, and the emitter-follower transistor pair Q9, Q10, therefore, may advantageously have a collector-emitter breakdown voltage that is below the voltage of the power supply 210. For example, the voltage of the power supply 210 may be about ten volts whereas the collector-emitter breakdown voltage may be about 3.3 volts. In some embodiments, the collector-emitter breakdown voltage may be closer to 3.3 volts. In other embodiments, the voltage of the power supply 210 may be about twelve volts and the collector-emitter breakdown voltage may be about five volts. Employing transistors having a collector-emitter breakdown voltage below the voltage of the power supply 210 may increase the operating speed of the Thevenin writer 200 and reduce space requirements.

Figure 3:
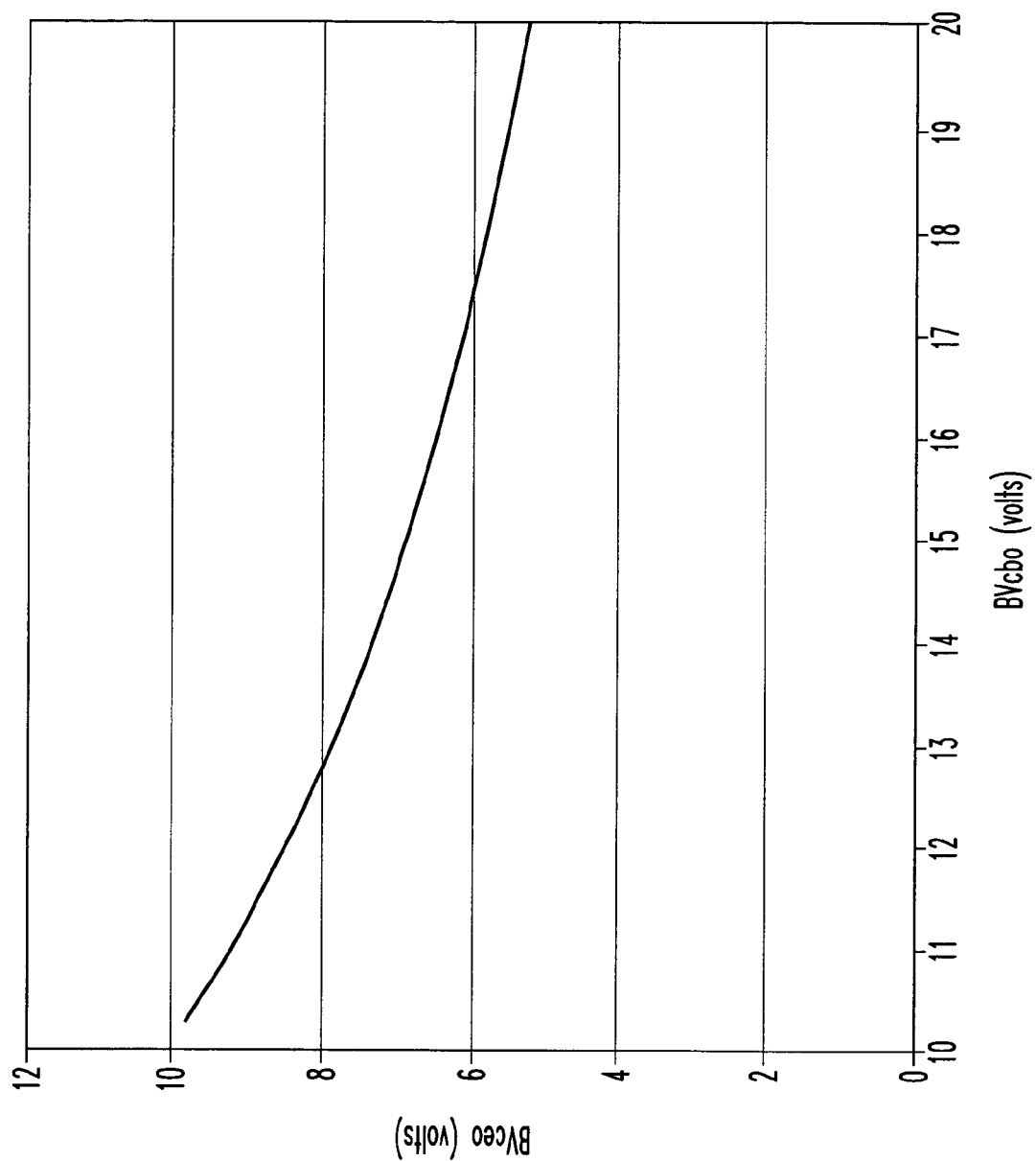
FIG. 3 illustrates a graph representing a relationship between collector-base and collector-emitter breakdown voltages in accordance with the principles of the present invention.

Turning now to FIG. 3, illustrated is a graph representing a relationship between collector-base and collector-emitter breakdown voltages in accordance with the principles of the present invention. FIG. 3 illustrates a curve representing the relationship of the collector-emitter breakdown voltage $BV_{CEO}$ to the collector-base breakdown voltage $BV_{CBO}$ for a minimum acceptable current gain of ten and an operating voltage of ten. FIG. 3 represents the region of acceptable breakdown voltages to be above and to the right of the curve. For example, a transistor having voltages of 12.8V and 8.0V for the collector-base breakdown voltage $BV_{CBO}$ and the collector-emitter breakdown voltage $BV_{CEO}$, respectively, may be employed within a circuit with a operating voltage of ten volts if a transistor current gain of ten is acceptable. Additionally, a transistor with breakdown voltages of 17.4V and 6.0V for the collector-base breakdown voltage $BV_{CBO}$ and the collector-emitter breakdown voltage $BV_{CEO}$, respectively, is likewise capable of performing in a circuit with a ten volt operating voltage.

Accordingly, for a given minimum acceptable current gain and a maximum operating voltage, a relationship between a minimum collector-base breakdown voltage $BV_{CBO}$ and a collector-emitter breakdown voltage $BV_{CEO}$ of a transistor may be determined. A process specification, therefore, may be obtained for a transistor that may be employed in circuitry having an operating voltage higher than a collector-emitter breakdown voltage $BV_{CEO}$ of the transistor. The process specification may be based on undesirable avalanche multiplication. For example, an empirical expression for an avalanche multiplication factor is given by equation 1:

$$M = \frac{1}{1 - \left(\frac{V_{CE}}{BV_{CBO}}\right)^N} \quad (1)$$

where $V_{CE}$ is the collector-emitter voltage required to turn on the transistor, $BV_{CBO}$ is the collector-base breakdown voltage and N is a parameter that is process related. The avalanche multiplication factor may be approximated by unity as given by equation 2:

$$M \leq \frac{\beta_{MIN}}{(\beta_{MIN} - 1)} \qquad (2)$$

where β is a current gain of the transistor. Equating equations 1 and 2 and solving for N yields equation 3:

$$N_{MIN} \geq \frac{\ln\left(\frac{1}{\beta_{MIN}}\right)}{\ln\left(\frac{V_{CE}^{MAX}}{BV_{CBo}}\right)} \qquad (3)$$

The minimum value for the process parameter N may be used to calculate a minimum value of the collector-emitter breakdown voltage $BV_{CEO}$ that is acceptable. This may be accomplished using equation 2 and solving for the value of the collector-emitter voltage that achieves the avalanche multiplication factor M that is necessary for $\alpha_F M=1$ using the calculated value of $N_{MIN}$ given by equation 4 as follows:

$$BV_{CEO} \geq BV_{CBO}(1-\alpha_F)^{N_{MIN}} \qquad (4)$$

where $\alpha_F$ is the emitter injection efficiency.

Assuming an acceptable β, a maximum operating voltage may be calculated for a given collector-base breakdown voltage $BV_{CBO}$ and a given collector-emitter breakdown voltage $BV_{CEO}$. Conversely, for a given operating voltage, acceptable breakdown voltages may be calculated. Accordingly, operating speeds of transistors may be maximized. For example, a collector-base breakdown voltage $BV_{CBO}$ of a high speed transistor may be maximized by increasing an epitaxial thickness, counter-doping the collector region and removing corners and edges from the collector-base junction. A Germanium-Silicon transistor may be ideally suited for maximizing because of an inherently high collector-emitter blocking voltage $BV_{CES}$. A high speed transistor, such as a Polar35 device operating at 30 GHz and up to about 11.67 volts may be advantageously used in high voltage circuitry operating at about 12 volts with minimum breakdown voltages about twelve volts for a collector-emitter blocking voltage $BV_{CES}$, about 16 volts for a collector-base breakdown voltage $BV_{CBS}$ and about five volts for a collector-emitter breakdown voltage $BV_{CEO}$.

Although the present invention has been described in detail, those skilled in the art should understand that they can make various changes, substitutions and alterations herein without departing from the spirit and scope of the invention in its broadest form.

What is claimed is:

1. A pre-amplifier, comprising:
   an emitter-follower transistor pair couplable to a power supply; and
   a differential transistor pair, having a collector-emitter breakdown voltage below a voltage of said power supply, that receives current from, and controlled by, said emitter-follower transistor pair.

2. The pre-amplifier as recited in claim 1 wherein said emitter-follower transistor pair has a collector-emitter breakdown voltage below said power supply voltage.

3. The pre-amplifier as recited in claim 1 wherein said power supply voltage is about ten volts.

4. The pre-amplifier as recited in claim 3 wherein said collector-emitter breakdown voltage is about three volts.

5. The pre-amplifier as recited in claim 1 wherein a current gain of said emitter-follower is about ten.

6. The pre-amplifier as recited in claim 1 wherein said power supply voltage is about twelve volts.

7. The pre-amplifier as recited in claim 6 wherein said collector-emitter breakdown voltage is about five volts.

8. A Thevenin writer coupled to a power supply, comprising:
   a write head;
   an emitter-follower transistor pair coupled to said write head and said power supply; and
   a differential transistor pair, having a collector-emitter breakdown voltage below a voltage of said power supply, that receives current from, and controlled by, said emitter-follower transistor pair.

9. The Thevenin writer as recited in claim 8 wherein said emitter-follower transistor pair has a collector-emitter breakdown voltage below said power supply voltage.

10. The Thevenin writer as recited in claim 8 wherein said power supply voltage is about ten volts.

11. The Thevenin writer as recited in claim 10 wherein said collector-emitter breakdown voltage is about three volts.

12. The Thevenin writer as recited in claim 8 wherein a current gain of said emitter-follower is about ten.

13. The Thevenin writer as recited in claim 8 wherein said power supply voltage is about twelve volts.

14. The Thevenin writer as recited in claim 13 wherein said collector-emitter breakdown voltage is about five volts.

15. A disk drive coupled to a power supply, comprising:
   a chassis;
   a motor coupled to said chassis;
   a platter coupled to said motor for rotation thereby;
   a write head actuator coupled to said chassis;
   a write arm coupled to said write head actuator for movement relative to said platter; and
   a write head coupled to said write arm distal to said write head actuator and including a Thevenin writer, including:
   an emitter-follower transistor pair couplable to said power supply, and
   a differential transistor pair, having a collector-emitter breakdown voltage below a voltage of said power supply, that receives current from, and controlled by, said emitter-follower transistor pair.

16. The disk drive as recited in claim 15 wherein said emitter-follower transistor pair has a collector-emitter breakdown voltage below said power supply voltage.

17. The disk drive as recited in claim 15 wherein said power supply voltage is about ten volts.

18. The disk drive as recited in claim 15 wherein said collector-emitter breakdown voltage is about three volts.

19. The disk drive as recited in claim 15 wherein current gain of said emitter-follower is about ten.

20. The disk drive as recited in claim 15 wherein said power supply voltage is about twelve volts.

21. The disk drive as recited in claim 20 wherein said collector-emitter breakdown voltage is about five volts.

* * * * *